United States Patent
Kim et al.

(10) Patent No.: US 7,486,557 B2
(45) Date of Patent: Feb. 3, 2009

(54) METHODS/CIRCUITS FOR PROGRAMMING FLASH MEMORY DEVICES USING OVERLAPPING BIT LINE SETUP AND WORD LINE ENABLE INTERVALS

(75) Inventors: Jin-Kook Kim, Gyeonggi-do (KR); Jin-Yub Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 128 days.

(21) Appl. No.: 11/480,236

(22) Filed: Jun. 30, 2006

(65) Prior Publication Data

US 2007/0019474 A1 Jan. 25, 2007

(30) Foreign Application Priority Data

Jul. 25, 2005 (JP) .................. 10-2005-0067476

(51) Int. Cl.
G11C 16/04 (2006.01)

(52) U.S. Cl. .............. 365/185.11; 365/185.18; 365/185.14; 365/185.23

(58) Field of Classification Search ........... 365/185, 365/185.11, 185.14, 185.18, 185.23
See application file for complete search history.

(56) References Cited

U.S. PATENT DOCUMENTS

| | | | |
|---|---|---|---|
| 5,537,362 A * | 7/1996 | Gill et al. ............ | 365/233.5 |
| 5,568,420 A | 10/1996 | Lim et al. ............ | 365/182 |
| 5,606,527 A | 2/1997 | Kwack et al. ............ | 365/201 |
| 5,661,682 A | 8/1997 | Lim et al. ............ | 365/185.17 |
| 5,677,873 A | 10/1997 | Choi et al. | |
| 5,696,717 A | 12/1997 | Koh | |
| 6,128,231 A * | 10/2000 | Chung ............ | 365/185.23 |
| 6,236,594 B1 * | 5/2001 | Kwon ............ | 365/185.11 |
| 6,353,555 B1 * | 3/2002 | Jeong ............ | 365/185.11 |
| 6,587,375 B2 | 7/2003 | Chung ............ | 365/185.13 |
| 2003/0235080 A1 * | 12/2003 | Yaegashi et al. ....... | 365/185.22 |
| 2005/0117399 A1 * | 6/2005 | Kwon et al. ............ | 365/185.28 |
| 2005/0248993 A1 * | 11/2005 | Lee et al. ............ | 365/185.29 |
| 2005/0254302 A1 * | 11/2005 | Noguchi ............ | 365/185.17 |

FOREIGN PATENT DOCUMENTS

| | | |
|---|---|---|
| JP | 2000-076882 | 3/2000 |
| JP | 2000-228097 | 8/2000 |
| JP | 2002-056688 | 2/2002 |
| KR | 1020020012407 | 2/2002 |

* cited by examiner

*Primary Examiner*—Huan Hoang
*Assistant Examiner*—Jay Radke
(74) *Attorney, Agent, or Firm*—Myers Bigel Sibley & Sajovec, P.A.

(57) ABSTRACT

A method of programming a flash memory device includes charging selection lines with a first voltage while applying program data to bit lines to during a bit line setup interval, then activating a block word line to electrically connect the selection lines to corresponding word lines, and then applying a second voltage, greater than the first voltage, to a selected one of the selection lines. Related devices are also disclosed.

28 Claims, 8 Drawing Sheets

METHODS/CIRCUITS FOR PROGRAMMING FLASH MEMORY DEVICES USING OVERLAPPING BIT LINE SETUP AND WORD LINE ENABLE INTERVALS

CROSS-REFERENCE TO RELATED APPLICATION

This U.S. non-provisional patent application claims priority under 35 U.S.C. § 119 of Korean Patent Application 2005-67476 filed on Jul. 25, 2005, the entire contents of which are hereby incorporated by reference.

FIELD OF THE INVENTION

The present invention relates to a semiconductor memory device and more specifically to a flash memory device and a program method of the same.

BACKGROUND

A nonvolatile memory device, known as a flash EEPROM (electrically erasable programmable read only memory), typically includes a memory cell array having memory cells including a floating gate transistor organized as memory blocks. Each of the memory blocks includes strings of the floating gate transistors (i.e., "NAND strings"). The floating gate transistors are connected in series between a string selection transistor and a ground selection transistor that are arranged in each string. A plurality of word lines are arranged so as to be intersected with the NAND strings. Each of the word lines is connected to a control gate of a corresponding floating gate transistor of each NAND string.

Flash memory devices and program methods are discussed in, for example, U.S. Pat. No. 5,568,420, entitled "NONVOLATILE SEMICONDUCTOR MEMORY DEVICE", U.S. Pat. No. 5,606,527, entitled "METHODS FOR DETECTING SHORT-CIRCUITED SIGNAL LINES IN NONVOLATILE SEMICONDUCTOR MEMORY AND CIRCUITRY THEREFOR", U.S. Pat. No. 5,661,682, entitled "NONVOLATILE SEMICONDUCTOR MEMORY DEVICE", U.S. Pat. No. 5,696,717, entitled "NONVOLATILE INTEGRATED CIRCUIT MEMORY DEVICES HAVING ADJUSTABLE ERASE/PROGRAM THRESHOLD VOLTAGE VERIFICATION CAPABILITY", and U.S. Pat. No. 6,236,594, entitled "FLASH MEMORY DEVICE INCLUDING CIRCUITRY FOR SELECTING A MEMORY BLOCK", all of which are incorporated herein by reference in their entireties.

Figure 1A:
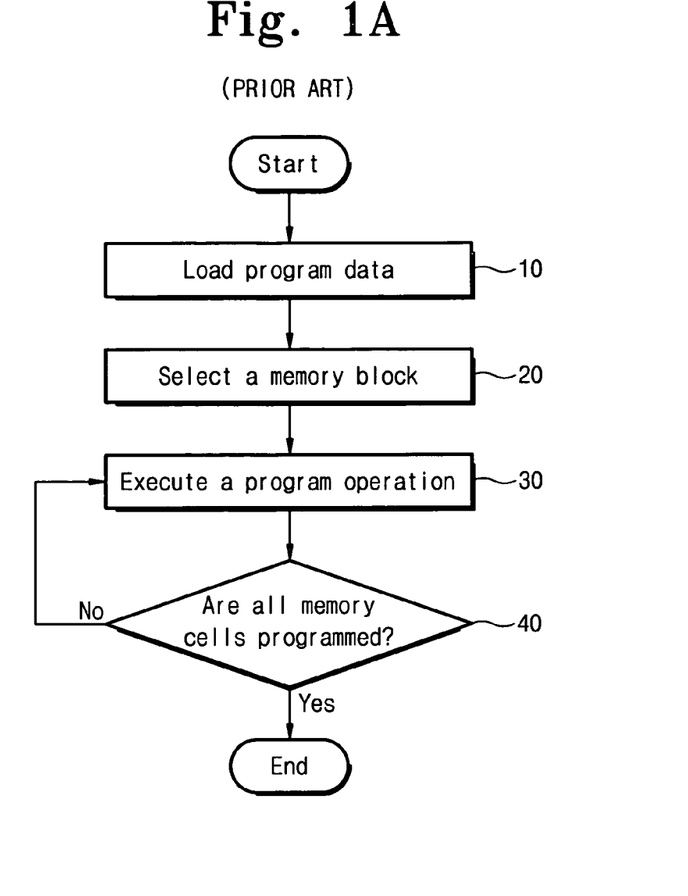
FIG. 1A is a flow chart showing a conventional program method of a flash memory device.

Referring to FIG. 1A showing a conventional program process of a flash memory device, program data is loaded in a register of a flash memory device (Block 10). When the program data is loaded, one of memory blocks is selected according to an inputted block address (Block 20). The memory block is selected by supplying a high voltage to a block word line so that a pass voltage and a program voltage are applied to the word lines without a voltage drop. The above-described operation for selecting a memory block is discussed in the above references, and further detailed explanation thereof will be omitted.

After the memory block is selected, a program operation is executed (Block 30). As well known to one skilled in the art, the program operation can be executed by setting bit lines to a bit line bias voltage based on program data and then supplying a program voltage and a pass voltage to corresponding word lines of the selected memory block through selection lines. Generally, after the word lines are driven with the pass voltage during a word line enable interval, only a selected word line is driven with the program voltage during a program execution interval. After the program execution interval, it is determined whether all memory cells are programmed (Block 40). If the memory cells all are programmed, the program operation is ended. If one or more of the memory cells are not programmed, Blocks 30 and 40 are repeated within a predetermined program loop number.

Figure 1B:
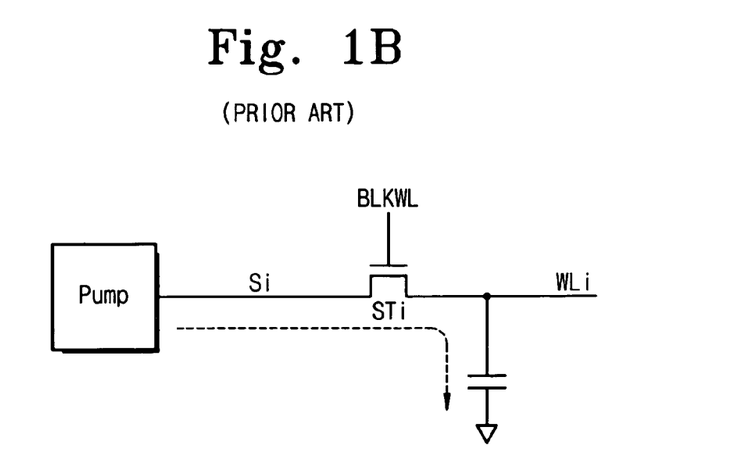
FIG. 1B is a diagram for describing a word line driving manner according to the program method in FIG. 1A.

A word line driving method according to the above program method is explained hereinafter with reference to FIG. 1B. First, a block word line BLKWL is driven with a high voltage in order to apply a program/pass voltage to a word line. Thus, a selection line Si and a word line WLi are electrically connected to each other through a switch transistor STi. Under this condition, the selection line Si is driven with the program/pass voltage by a pump in a high voltage generating circuit. In this case, the pump of the high voltage generating circuit may instantly charge every parasitic capacitance of the selection line Si and the word line WLi. This can be an obstacle to improving a program speed. Moreover, it takes longer time to charge a word line if the number of memory cells connected to the word line WLi is increased. Such a problem can be solved by increasing a pump capacity. But, this may result in increase in a chip area.

SUMMARY

Embodiments according to the invention can provide methods/circuits for programming flash memory devices using overlapping bit line setup and word line enable intervals. In some embodiments according to the invention, a method of programming a flash memory device includes charging selection lines with a first voltage while applying program data to bit lines to during a bit line setup interval, then activating a block word line to electrically connect the selection lines to corresponding word lines, and then applying a second voltage, greater than the first voltage, to a selected one of the selection lines.

In some embodiments according to the invention, a method of programming a flash memory device includes applying program data to bit lines during a bit line setup interval, charging selection lines with a pass voltage during a word line enable interval which overlaps with the bit line setup interval, electrically connecting the selection lines to corresponding word lines after completion of the bit line setup interval, and driving one of the selection lines with a program voltage during a program execution interval after completion of the word line enable interval.

In some embodiments according to the invention, a flash memory device includes a memory cell array including memory cells arranged in a matrix of word lines and bit lines. A page buffer circuit is configured to apply program data to the bit lines during a bit line setup interval. A first decoding and driving circuit is configured to apply a program voltage and/or a pass voltage to selection lines. A second decoding and driving circuit is configured to electrically connect the selection lines to corresponding word lines during a word line enable interval and a control logic circuit, is electrically connected to the page buffer circuit and to the first and second decoding and driving circuits. The control logic circuit is configured control charging of the selection lines with the pass voltage during a bit line setup interval.

In some embodiments according to the invention, a flash memory device includes a memory cell array including nonvolatile memory cells arranged in a matrix of word lines and bit lines. A selection line driving circuit is designed to drive selection lines with a pass voltage and a program voltage in response to a first enable signal and a second enable signal. A decoding circuit is designed to decode a block address in response to a third enable signal. A block word line driving circuit is designed to activate a block word line in response to an output of the decoding circuit. A switch circuit is designed to connect the selection lines to corresponding word lines in response to an activation of the block word line and a control logic circuit is designed to generate the first to third enable signals during a program operation, wherein the control logic circuit activates the first enable signal so as to drive the selection lines with the pass voltage at a bit line setup interval of the program operation.

In some embodiments according to the invention, a method of programming a flash memory-device includes charging selection lines with a first voltage, activating a block word line to electrically connect the selection lines to respective word lines, and applying a second voltage, greater than the first voltage, to one of the selection lines after activation of the block word line, where the flash memory device includes a plurality of word lines, selection lines corresponding to the respective word lines, and a switch circuit having transistors connected between the word lines and the selection lines and controlled by a block word line.

DESCRIPTION OF EMBODIMENTS
ACCORDING TO THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
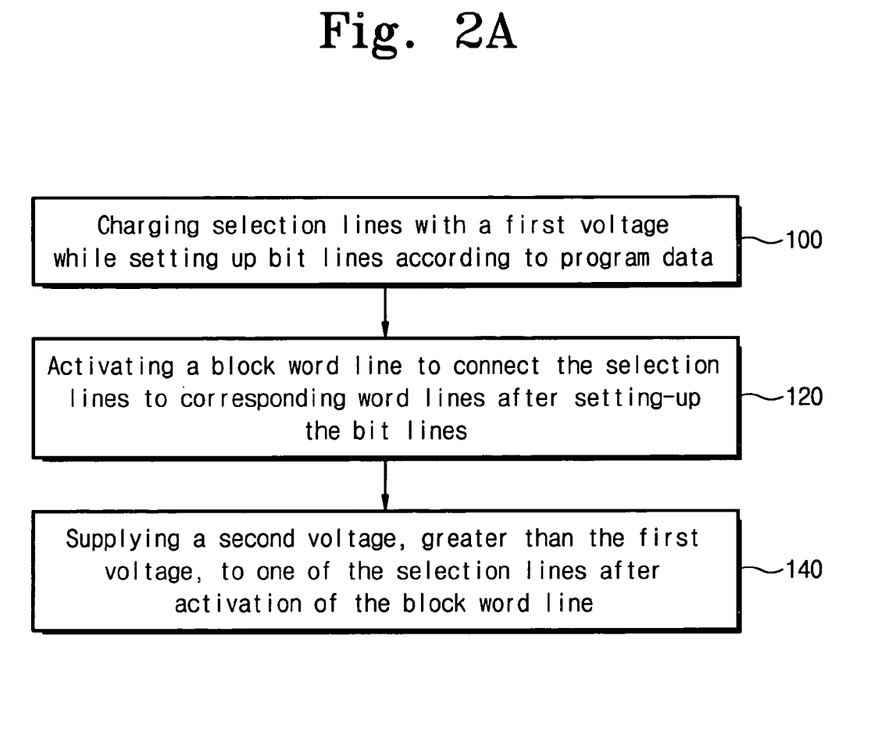
FIG. 2A is a flow chart showing programming flash memory devices in some embodiments according to the present invention.
Figure 2B:
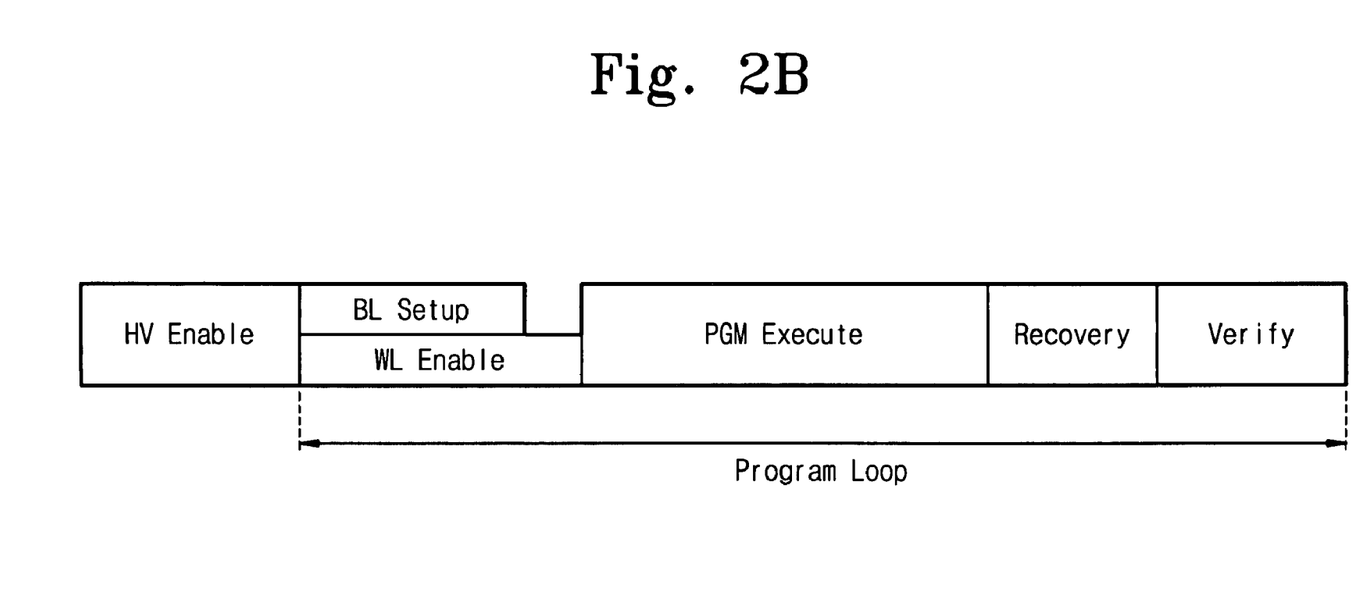
FIG. 2B is a diagram showing a programming loop of flash memory devices in some embodiments according to the present invention.

FIG. 2A is a flow chart showing programming of a flash memory device in some embodiments according to the present invention and FIG. 2B shows a programming loop for a flash memory device in some embodiments according to the present invention.

Referring to FIG. 2A, in some embodiments according to the invention, a programming method for a flash memory device includes charging selection lines with a first voltage while setting up bit lines according to program data (Block 100); after setting up the bit lines, activating a block word line so as to connect the selection lines to corresponding word lines (Block 120); and after activating the block word line, supplying a second voltage higher than the first voltage to one of the selection lines (Block 140). As illustrated in FIG. 2B, the bit lines are set to a bit-line bias voltage (e.g., a power supply voltage or a ground voltage) based on data loaded on a page buffer circuit during a bit-line-setup interval. During a word line enable interval that overlaps the bit line setup interval, selection lines each corresponding to word lines are charged with a first voltage, i.e. a pass voltage. After the bit line setup interval ends, a block word line is activated to connect the selection lines with the corresponding word lines. When the word line enable interval ends, a chosen selection line (i.e., a selected word line) is driven with a second voltage that is a program voltage.

Figure 3:
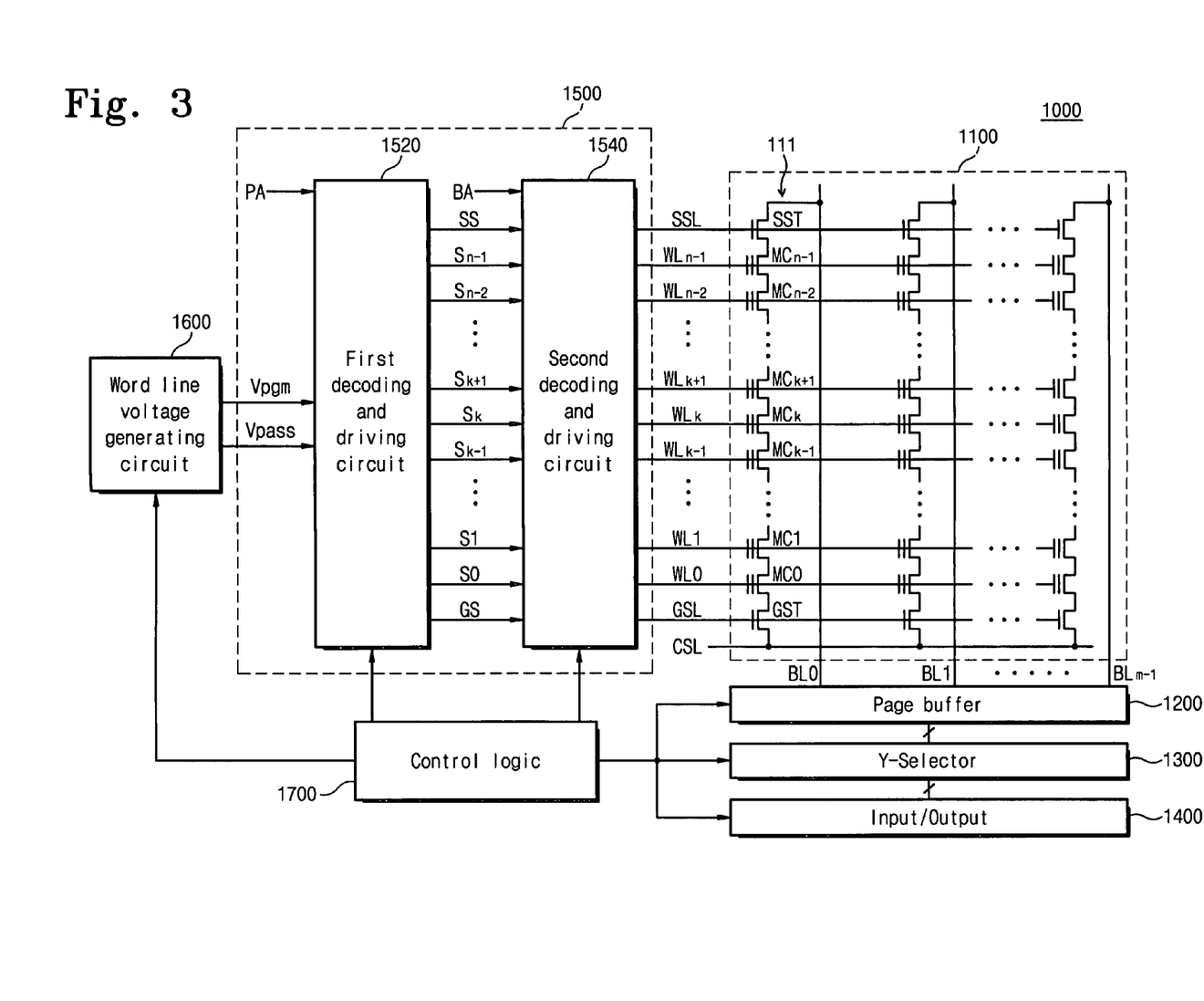
FIG. 3 is a block diagram showing a flash memory device in some embodiments according to the present invention.

FIG. 3 is a block diagram showing a flash memory device in some embodiments according to the invention wherein a flash memory device 1000 includes a memory cell array 1100 for storing data information. The memory cell array 1100 includes a plurality of memory blocks although only one memory block is illustrated. The memory cell array 1100 includes a plurality of strings 111, each of which includes a string selection transistor SST connected to a corresponding bit line, a ground selection transistor GST connected to a common source line CSL, and memory cells MCn-1~MC0 connected in series between the selection transistors SST and GST. As shown in FIG. 3, the string selection transistor SST, the ground selection transistor GST, and the memory cells MCn-1~MC0 are connected to a string selection line SSL, a ground selection line GSL, and word lines WLn-1~WL0, respectively. The flash memory device 1000 further includes a page buffer circuit 1200, a column selection circuit 1300, an input/output circuit 1400, a row selection circuit 1500, a word line voltage generating circuit 1600, and a control logic circuit 1700.

The page buffer circuit 1200 is controlled by the control logic circuit 1700 and serves as a sense amplifier or a write driver in accordance with an operation mode. In a read operation, for example, the page buffer circuit 1200 reads data from the memory cell array 1100 and temporarily stores the read data. In a programming operation, the page buffer circuit 1200 drives each of bit lines BL0~BLm-1 with a bit line bias voltage based on the loaded program data. The bit line bias voltage is, for example, a power supply voltage or a ground voltage. Although not shown in FIG. 3, in some embodiments according to the invention the page buffer circuit 1200 may include page buffers each corresponding to the bit lines BL0~BLm-1. In this case, one row provides one page, in some embodiments according to the invention, one row may have two or more pages. In this case, bit lines in one of the pages of one row may be connected to corresponding page buffers in the page buffer circuit 1200, respectively. The column selection circuit 1300 is controlled by the control logic circuit 1700 and selects the page buffers in specific units. In a read operation, the column selection circuit 1300 sends data bits in selected page buffers to the input/output circuit 1400. In a program operation, the column selection circuit 1300 sends data bits from the input/output circuit 1400 to selected paged buffers.

Still referring to FIG. 3, the row selection circuit 1500 receives a pass voltage Vpass and a program voltage Vpgm from the word line voltage generating circuit 1600. Then, the row selection circuit 1500 applies the program voltage Vpgm or the pass voltage Vpass to word lines WL0~WLn-1 based on the control of the control logic circuit 1700. For example, in some embodiments of programming operations according to the invention, the row selection circuit 1500 drives the word lines WL0~WLn-1 with the pass voltage Vpass. After a predetermined time interval elapses, the row selection circuit 1500 drives the selected word line with the program voltage Vpgm, as described in more detail below.

In some embodiments according to the invention, the row selection circuit 1500 includes a first decoding and driving block 1520 and a second decoding and driving block 1540. The first decoding and driving block 1520 receives the program voltage Vpgm, the pass voltage Vpass and a page address PA. The first decoding and driving block 1520 drives selection lines S0~Sn-1 with the voltages Vpass and Vpgm and selection lines SS and GS with a predetermined voltage (e.g., a power supply voltage, a ground voltage or a read voltage), based on the control of the control logic circuit 1700. The selection lines S0~Sn-1 correspond to the word lines WL0~WLn-1, respectively. The second decoding and driving block 1540 receives a block address BA. Then, the second decoding and driving block 1540 electrically connects the selection lines S0~Sn-1 to the corresponding word lines WL0~WLn-1 and the selection lines SS and GS to the string and ground selection lines SSL and GSL, based on the control of the control logic circuit 1700.

In some embodiments according to the invention, the word line voltage generating circuit 1600 is controlled by the control logic circuit 1700 and generates the program voltage Vpgm and the pass voltages Vpass as word lines voltages in the program operation. The word line voltage generating circuit 1600 uses a charge pump circuit to generate a high voltage VPP in a high voltage enable interval. The high voltage VPP is adjusted to desired voltages (e.g., Vpgm and Vpass) using a regulator. Exemplary word line voltage generating circuits are disclosed in, for example, U.S. Pat. No. 5,642,309 entitled "AUTO-PROGRAM CIRCUIT IN A NONVOLATILE SEMICONDUCTOR MEMORY DEVICE" and U.S. Pat. No. 5,619,124, entitled "REFERENCE VOLTAGE GENERATOR IN A SEMICONDUCTOR INTEGRATED DEVICE", both of which are incorporated herein by reference in their entireties.

In some embodiments according to the invention, the control logic circuit 1700 is organized to control operations of the flash memory device 1000. For example, the control logic circuit 1700 controls the first decoding and driving block 1520 so that the selection lines S0~Sn-1 are charged with a pass voltage Vpass in a bit line setup interval of a program operation. The control logic circuit 1700 controls the second decoding and driving block 1540 so that the selection lines S0~Sn-1 are electrically connected to the word lines WL0~WLn-1 in the end of the bit-line-setup interval. The control logic circuit 1700 controls the first decoding and driving block 1520 so that one of the selection lines S0~Sn-1 is driven with the program voltage Vpgm after the selection lines S0~Sn-1 is electrically connected to the word lines WL0~WLn-1. In other words, the control logic circuit 1700 controls the first and second decoding and driving blocks 1520 and 1540 so as to drive the selection lines S0~Sn-1 with the pass voltage Vpass in the bit line setup interval, so as to electrically connect the selection lines S0~Sn-1 to the word lines WL0~WLn-1 in the end of the bit line selection interval, and so as to drive the selected word lines with the program voltage Vpgm in a program execution interval.

With this driving manner, in some embodiments according to the invention, it may be possible to reduce a time required to drive the word lines by driving the selection lines S0~Sn-1 with the pass voltage Vpass in the bit line setup interval. That is, as the bit line setup interval overlaps with the word line enable interval, the program time can be reduced by an interval of time corresponding to the bit line setup interval.

Figure 4:
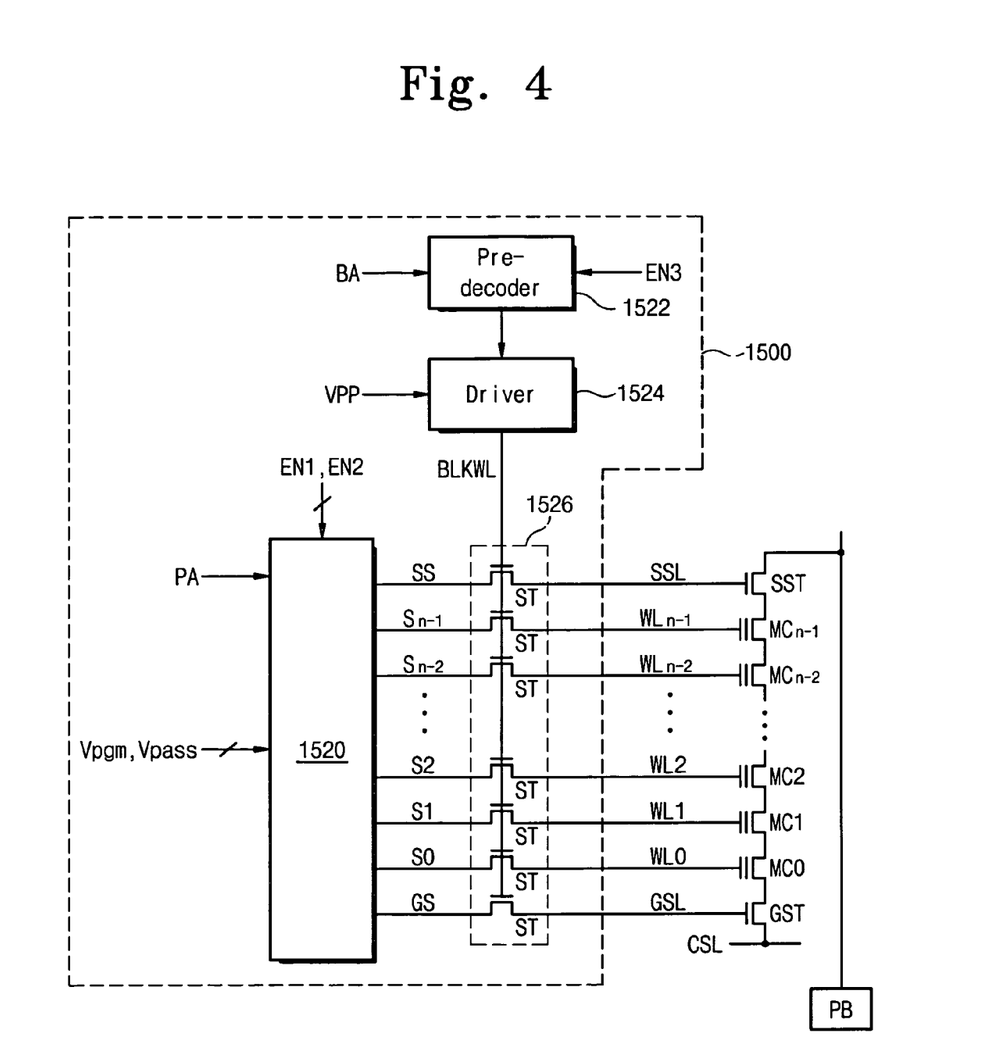
FIG. 4 is a schematic block diagram showing a second decoding and driving circuit in FIG. 3.

FIG. 4 is a schematic block diagram showing first and second decoding and driving circuits in FIG. 3. Referring to FIG. 4, as a selection line driving circuit, the first decoding and driving blocks 1520 is supplied with a page address PA, a program voltage Vpgm and a pass voltage Vpass. The first decoding and driving blocks 1520 drives the selection lines S0~Sn-1 with the supplied voltages Vpgm and Vpass in response to first and second enable signals EN1 and EN2 from the control logic circuit 1700. The first enable signal EN1 indicates a word line enable interval and the second enable signal EN2 indicates a program execution interval. The first decoding and driving block 1520 drives the respective selection lines S0~Sn-1 with the pass voltage Vpass in response to an activation of the first enable signal EN1. The first enable signal EN1 is activated in synchronization with to a start of a bit line setup interval. The first decoding and driving block 1520 drives a selection line of the page address PA with the program voltage Vpgm. That is, the page address PA is an address for selecting one of the word lines.

When the second enable signal EN2 is activated, any one of the selection lines S0~Sn-1 is selected according to the page address PA. The remaining selection lines are driven with the pass voltage Vpass during an active interval of the second enable signal EN2. Selection lines SS and GS may be driven with a specific voltage (e.g., a voltage lower than a power supply voltage) and a ground voltage, respectively, in the word line enable interval and the program execution interval. As a block word line driving circuit, the second decoding and driving block 1540 includes a predecoder 1522, a driver 1524 and a switch 1526.

The predecoder 1522 receives a block address BA for selecting a memory block and decodes the block address BA in response to an activation of the third enable signal EN3. The driver 1524 drives a block word lined BLKWL with a high voltage VPP in response to an output of the predecoder 1522. The high voltage VPP is provided from a word lined voltage generating circuit 1600 in FIG. 3, and is set higher than the program voltage Vpgm so that the voltages of the selection lines S0~Sn-1 are transferred to the corresponding word lines WL0~WLn-1 without a voltage drop. The switch 1526 is comprises of switch transistors ST connected between the selection lines S0~Sn-1 and the word lines WL0~WLn-1, between the selection line SS and a string selection liens SSL and between a selection line GS and a ground selection line GSL. Gates of the switch transistors ST are connected to the block word line BLKWL in common. The third enable signal EN3 is activated in synchronization with an end of the bit-line-setup interval and inactivated when a program loop is ended. The switch transistors ST are well-known high-voltage transistors suitable for enduring the high voltage VPP.

Figure 5:
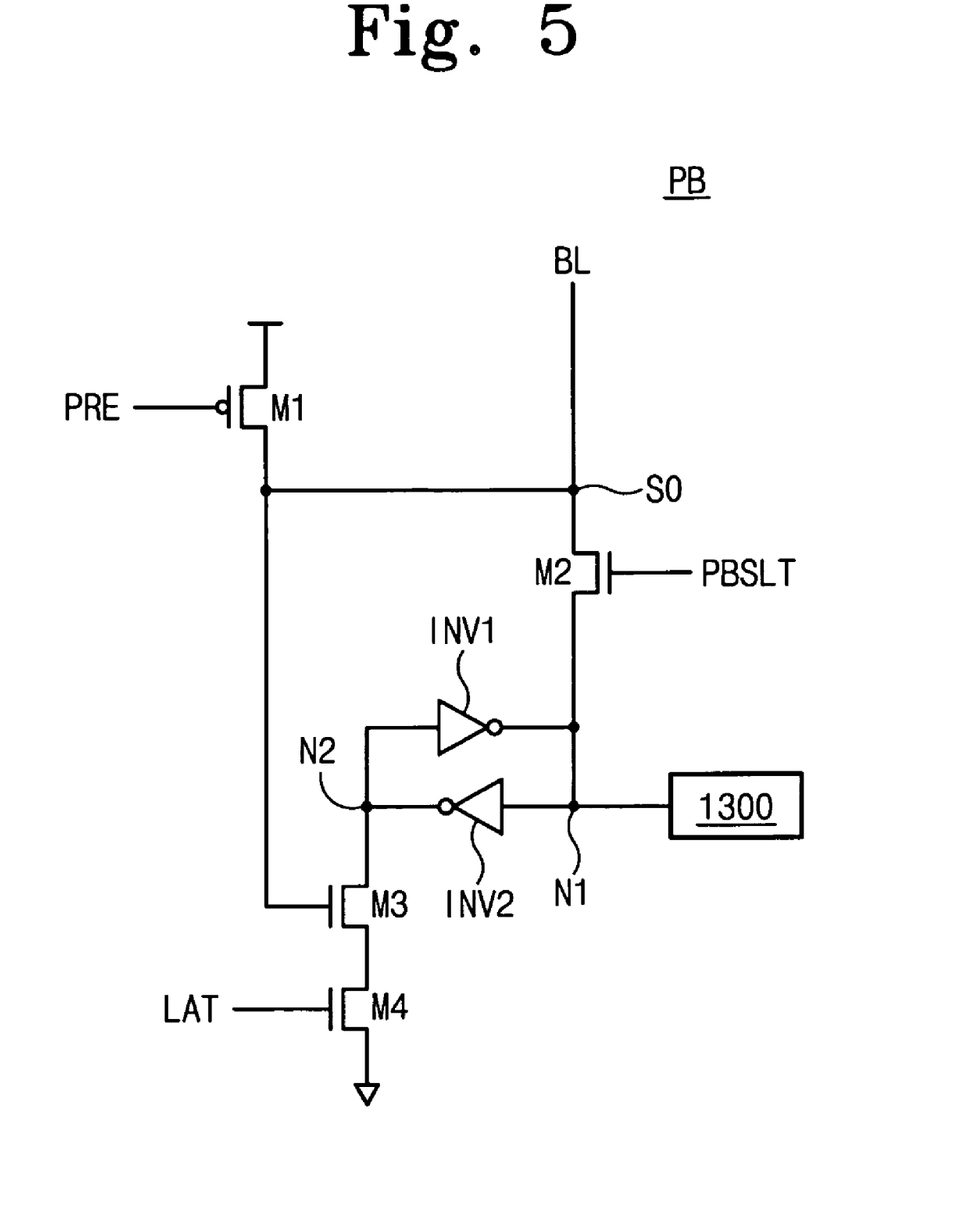
FIG. 5 is a circuit diagram showing a page buffer in FIG. 4.

FIG. 5 is a circuit diagram showing a page buffer in FIG. 4. Referring to FIG. 5, the page buffer PB comprises a latch including inverters INV1 and INV2, a PMOS transistor M1 and NMOS transistors M2, M3, and M4. The PMOS transistor M1 is connected between a power supply voltage and a sense node S0 and controlled by a control signal PRE. The NMOS transistor M2 is connected between a bit line BL and a latch node N1 and controlled by a control signal PBSLT. The NMOS transistors M3 and M4 are connected between a node N2 and a ground voltage in series. A gate of the NMOS transistor M3 is connected to the sense nod S0, and a gate of the NMOS transistor M4 is connected to receive a control signal LAT. Data input through a column selection circuit 1300 is stored in the latch in the page buffer PB during a data load interval of a program operation.

When the data is loaded, a control signal PBSLT is activated to a high level. This enables the latch node N1 to be connected electrically to the bit line BL. In this case, the bit lines BL is driven with the power supply voltage or the ground voltage according to the loaded data. For example, if data '1' is loaded on the latch (INV1 and INV2), the bit line BL is driven with the power supply voltage. If data '0' is loaded on the latch (INV1 and INV2), the bit line BL is driven with the ground voltage. The activated control signal PBLST is inactivated when a program execution interval ⑥ (in FIG. 6) of the program loop is ended. This means that a bias state of the bit line maintains until the program execution interval is ended.

Figure 6:
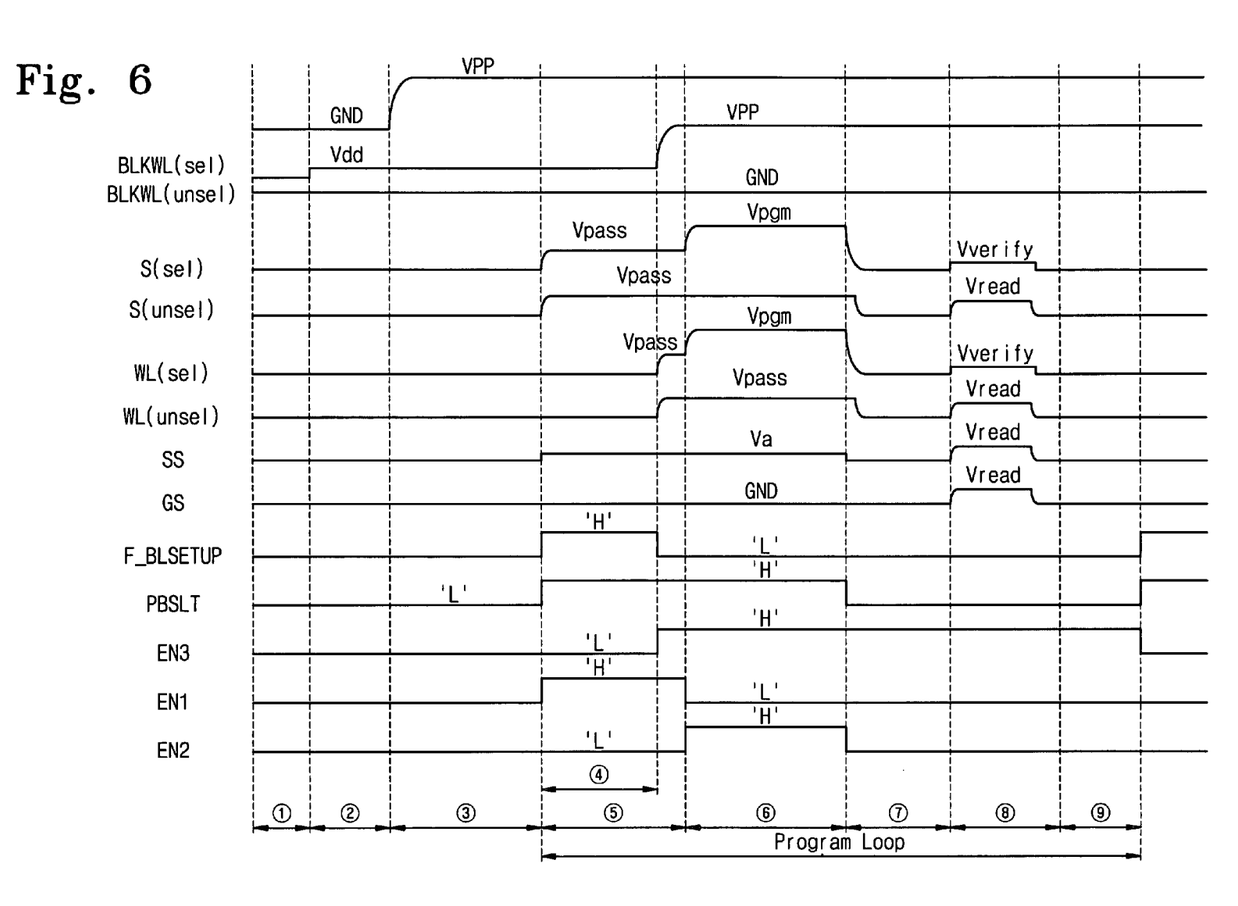
FIG. 6 is a timing diagram showing a program operation of a flash memory device in some embodiments according to the present invention.

FIG. 6 is a timing diagram for describing a program operation of a flash memory device in accordance with the present invention. Hereinafter, a program method of the flash memory device of the present invention will be described in detail with reference to the above figures.

Once a program operation commences, a page buffer circuit 1200 is reset by a control of a control logic circuit 170 during a page buffer reset interval (①). During a data load interval (②), page data to be programmed is loaded on the page buffer circuit 1200 through an input/output circuit 1400 and a column selection circuit 1300. Once the page data to be programmed is loaded, the control logic circuit 1700 activates a word line voltage generating circuit 1600 to generates a high voltage VPP during a high voltage enable interval (③). If the high voltage VPP reaches a desired target voltage, the control logic circuit 1700 controls the page buffer circuit 1200 so that bit lines are set to a bit line bias voltage (e.g., a power supply voltage and a ground voltage) according to the loaded data during a bit line setup interval (④). That is to say, the control logic circuit 1700 activates a control signal PBSLT to a high level. This makes a latch node N1 be connected electrically to the bit line BL. In this case, each of the bit lines is driven with a ground voltage or a power supply voltage based on the loaded data. If data '1', for example, is loaded on the page buffer circuit 1200, a bit line is driven with the power voltage. If data '0' is loaded on the page buffer circuit 1200, a bit line is grounded. In FIG. 6, a signal F_BLSETUP indicates the bit line setup interval and is a flag signal that is used in the control logic circuit 1700.

The control logic circuit 1700, as illustrated in FIG. 6, activates a first enable signal EN1 when the bit line setup interval starts. As the enable signal EN1 is activated, a first decoding and driving block 1520 drives selection lines S0~Sn-1 with a pass voltage Vpass. At this time, since a third enable signal EN3 is inactivated, switch transistors ST are turned off. This enables word lines WL0~WLn-1 to be electrically disconnected with the selection lines S0~Sn-1 charged respectively with the pass voltage Vpass. In addition, when the word line enable interval starts, a selection line SS is driven with a specific voltage Va (e.g., a power supply voltage or lower), and a selection line GS is driven with a ground voltage. When the bit line setup interval (④) is ended, the control logic circuit 1700 activates the third enable signal EN3. A second decoding and driving block 1540 drives a block word line BLKWL with a high voltage VPP in response to an activation of the third enable signal EN3. As the block word line BLKWL is activated, the selection lines S0~Sn-1 are electrically connected to corresponding word lines WL0~WLn-1 through the switch transistors ST. The selection lines SS and GS are electrically connected to the string and ground selection lines SSL and GSL though the switch transistors ST. In this case, the word lines WL0~WLn-1 are not directly driven by the word line voltage generating circuit 1600 but firstly driven by charged voltages of the selection lines S0~Sn-1 that serve as power capacitance. That is, charge sharing arises between the word lines WL0~WLn-1 and the selection lines S0~Sn-1. When the pass voltage is lowered after the charge sharing, the lowered pass voltage may be recovered to a target voltage by a pumping operation of the word line voltage generating circuit 1600.

As the string selection line SSL is driven by the specific voltage Va, channels of the strings 111 are connected to the bit lines BL0~BLm-1 through corresponding string selection transistors SST, respectively. This enables the channels to be charged with a power supply voltage or a ground voltage. If a channel is charged with the power supply voltage, a string selection transistor SST is shut off. This means that the channel is electrically disconnected with a corresponding bit line. However, if the channel is grounded, it is electrically connected to the corresponding bit line. This means that the channel is connected to a latch node N1 of a page buffer PB until the program execution interval (⑥) is ended. That is, a channel is maintained at a ground voltage through a page buffer PB until the program execution interval (⑥) is ended. When a program voltage Vpgm is applied to a selected word line, memory cells in floated channels are program inhibited in a well-known self boosting scheme. An Exemplary self boosting scheme is disclosed in U.S. Pat. No. 5,677,873 entitled "METHOD OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN", and U.S. Pat. No. 5,991,202 entitled "METHOD FOR REDUCING PROGRAM DISTURB DURING SELF- BOOSTING IN A NAND FLASH MMEORY", which are incorporated herein by reference in their entirety.

After an elapse of the word line enable interval ((5)) where the word lines WL0~WLn-1 are charged with the pass voltage Vpass, the control logic circuit 1700 inactivates the first enable signal EN1 and activates the second enable signal EN2. As the second enable signal EN2 is activated, the first decoding and driving block 1520 drives a selection line of a page address RA with the program voltage Vpgm. That is, the word line corresponding to the page address RA is driven with the program voltage Vpgm. In this case, memory cells are programmed or program inhibited based on a channel state (e.g., a floating state or a grounded state) as described above. When the program execution interval ((6)) is ended, the control signal PBSLT is inactivated to a low level. Then, the selection lines S0~Sn-1 and the word lines WL0~WLn-1 are discharged ((7)), and the page buffer circuit 1200 reads cell data from the memory cells of the selected word line during a verify read interval ((8)). During a column scan interval ((9)) where it is checked whether all memory cells in the selected word line are programmed to a desired threshold voltage, the read data of the page buffer circuit 1200 is sent to a pass/fail check circuit (not shown) through a column selection circuit 1300. In FIG. 6, the intervals ((4))~((9)) organize a program loop, which is repeated until all memory cells of the selected word line are programmed to a given threshold voltage.

Figure 7:
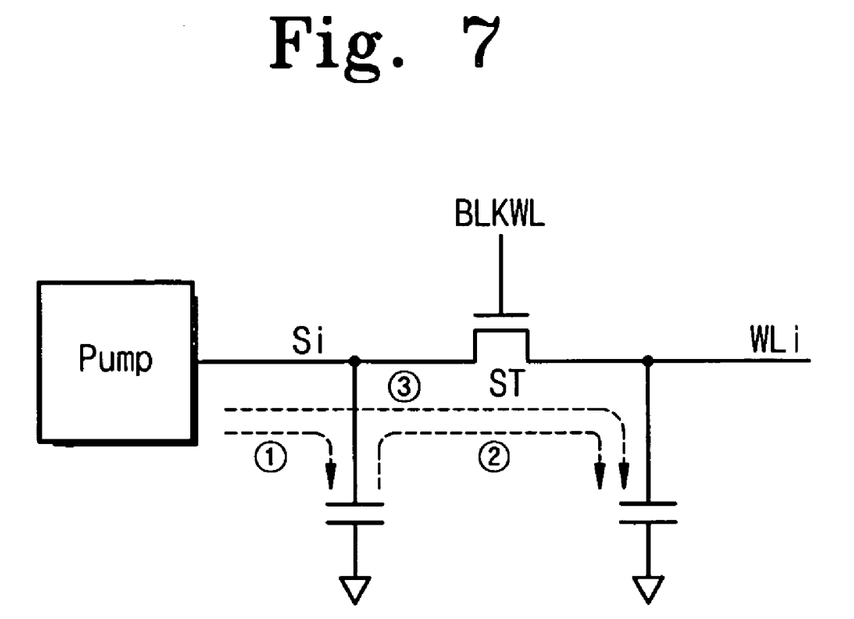
FIG. 7 is a diagram showing a word line driving manner in accordance with the program operation in FIG. 6.

According to the above explanation, word lines WL0~WLn-1 are driven in the following manner. First, selection lines S0~Sn-1 are charged with a pass voltage Vpass (marked with an arrow ((1)) in FIG. 7). As a block word line BLKWL is activated when a bit line setup interval is ended, the word lines WL0~WLn-1 are firstly driven by voltages of the selection lines S0~Sn-1 serving as power capacitance (marked with an arrows ((2)) in FIG. 7). The driving of the word lines is performed in a charge sharing manner. Afterwards, when the voltages of the word lines WL0~WLn-1 are lowered below the pass voltage Vpass, the word lines WL0~WLn-1 are driven directly by a pump in a word line voltage generating circuit 1600 (marked with an arrow ((3)) in FIG. 7). Then, the program voltage Vpgm may be applied to a selected word line. It is possible to reduce a program time by charging the selection lines S0~Sn-1 in the bit-line-setup interval. Furthermore, by driving word lines through the charge sharing manner and the pumping manner, it is possible to drive a word line within a rapid interval of time without increase in a pump capacity though word line loading increases. In a case where no word line loading increases, it is possible to reduce a pump capacity of a word line voltage generating circuit.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed:

1. A method of programming a flash memory device comprising:
   charging selection lines with a first voltage while applying program data to bit lines during a bit line setup interval; then
   activating a block word line to electrically connect the selection lines to corresponding word lines; and then
   applying a second voltage, greater than the first voltage, to a selected one of the selection lines.

2. The method of claim 1 further comprising:
   applying the first voltage to unselected remaining ones of the selection lines while the second voltage is applied to the selected one of the selection lines.

3. The method of claim 1, further comprising:
   inactivating the activated block word line when a program loop of a selected cell of the flash memory device ends.

4. The method of claim 1, wherein activating a block word line further comprises
   withholding the first voltage from the corresponding word lines when the block word line is activated to allow charge sharing between the selection lines and the corresponding word lines, wherein the second voltage is provided by a charge pump.

5. The method of claim 1, wherein the first voltage comprises a pass voltage and the second voltage comprises a program voltage.

6. A method of programming a flash memory device, comprising:
   applying program data to bit lines during a bit line setup interval;
   charging selection lines with a pass voltage during a word line enable interval, which overlaps with the bit line setup interval;
   electrically connecting the selection lines to corresponding word lines after completion of the bit line setup interval; and
   driving one of the selection lines with a program voltage during a program execution interval after completion of the word line enable interval.

7. The method of claim 6, wherein the bit line setup interval is shorter than the word line enable interval.

8. The method of claim 6, wherein remaining selection lines are driven with the pass voltage during the program execution interval of a selected cell of the flash memory device.

9. The method of claim 6, wherein the selection lines are electrically connected to the corresponding word lines as a block word line is activated.

10. The method of claim 9, wherein the activated block word line is inactivated after a program loop of a selected cell of the flash memory device ends.

11. The method of claim 6, wherein electrically connecting the selection lines to corresponding word lines further comprises:
    withholding a voltage from a charge pump circuit from the corresponding word lines to allow charge sharing between the selection lines and the corresponding word lines, wherein the program voltage is provided by the charge pump circuit.

12. A flash memory device comprising:
    a memory cell array including memory cells arranged in a matrix of word lines and bit lines;
    a page buffer circuit configured to apply program data to the bit lines during a bit line setup interval;
    a first decoding and driving circuit configured to apply a program voltage and/or a pass voltage to selection lines;
    a second decoding and driving circuit configured to electrically connect the selection lines to corresponding word lines during a word line enable interval; and
    a control logic circuit, electrically connected to the page buffer circuit and the first and second decoding and driving circuits, the control logic circuit configured to control charging of the selection lines with the pass voltage during a bit line setup interval.

13. The device of claim 12, wherein the control logic circuit is further configured to electrically connect the selection lines to the corresponding word lines after the bit line setup interval ends.

14. The device of claim 13, wherein the control logic circuit is further configured to apply a program voltage to a selected one of the selection lines after the selection lines are connected to the corresponding word lines and during a program execution interval.

15. The device of claim 14, wherein the pass voltage is applied to remaining ones of the selection lines during the program execution interval.

16. The device claim 12, wherein the control logic circuit is further configured to apply the program data to the bit lines during the bit line setup interval.

17. A flash memory device comprising:
a memory cell array including nonvolatile memory cells arranged in a matrix of word lines and bit lines;
a selection line driving circuit designed to drive selection lines with a pass voltage and a program voltage in response to a first enable signal and a second enable signal;
a decoding circuit designed to decode a block address in response to a third enable signal;
a block word line driving circuit designed to activate a block word line in response to an output of the decoding circuit;
a switch circuit designed to connect the selection lines to corresponding word lines in response to an activation of the block word line; and
a control logic circuit designed to generate the first to third enable signals during a program operation,
wherein the control logic circuit activates the first enable signal so as to drive the selection lines with the pass voltage at a bit line setup interval of the program operation.

18. The device of claim 17, wherein at an end of the bit line setup interval, the control logic circuit activates the third enable signal so as to connect the corresponding word lines to the selection lines through the switch circuit.

19. The device of claim 18, wherein after the third enable signal is activated, the control logic circuit activates the second enable signal to drive one of the selection lines with the program voltage.

20. The device of claim 19, wherein the first enable signal is inactivated when the second enable signal is activated.

21. The device of claim 17, wherein the pass voltage and the program voltage are supplied from a high voltage pump circuit.

22. The device of claim 21, wherein the word lines are driven by a charge sharing manner with the selection lines during an active interval of the first enable signal and driven by the high voltage pump circuit during an active interval of the second enable signal.

23. The device of claim 17, further comprising a page buffer circuit which is controlled by the control logic circuit so as to set up the bit lines based on program data during the bit line setup interval.

24. A method of programming a flash memory device including a plurality of word lines, selection lines corresponding to the respective word lines, and a switch circuit having transistors connected between the word lines and the selection lines and controlled by a block word line, the method comprising:
charging selection lines with a first voltage;
activating a block word line to electrically connect the selection lines to respective word lines; and
applying a second voltage, greater than the first voltage, to one of the selection lines after activation of the block word line.

25. The method of claim 24, wherein the activated block word line is inactivated at an end of a program loop of a selected cell of the flash memory device.

26. The method of claim 24, wherein activating a block word line further comprises:
withholding the first voltage from the respective word lines when the block word line is activated to allow charge sharing between the selection lines and the respective word lines, wherein the second voltage is provided by a charge pump.

27. The method of claim 24, wherein the first voltage comprises a pass voltage and the second voltage comprises a program voltage.

28. The method of claim 24, wherein bit lines are set up with a bit line bias voltage based on program data while the selection lines are charged with the first voltage.

* * * * *